(12) United States Patent
Mathew

(10) Patent No.: US 11,525,861 B2
(45) Date of Patent: Dec. 13, 2022

(54) SYSTEMS AND METHODS FOR DETERMINING LIFE OF A MOTOR USING ELECTROCARDIOGRAM (EKG) SENSORS

(71) Applicant: UST Global Inc, Aliso Viejo, CA (US)

(72) Inventor: Kuruvilla Mathew, Aliso Viejo, CA (US)

(73) Assignee: UST Global Inc, Aliso Viejo, CA (US)

( * ) Notice: Subject to any disclaimer, the term of this patent is extended or adjusted under 35 U.S.C. 154(b) by 14 days.

(21) Appl. No.: 17/186,190

(22) Filed: Feb. 26, 2021

(65) Prior Publication Data

US 2021/0270902 A1 Sep. 2, 2021

Related U.S. Application Data

(60) Provisional application No. 62/983,229, filed on Feb. 28, 2020.

(51) Int. Cl.
*G01R 31/34* (2020.01)
*G01N 29/44* (2006.01)

(52) U.S. Cl.
CPC .......... *G01R 31/343* (2013.01); *G01N 29/44* (2013.01)

(58) Field of Classification Search
None
See application file for complete search history.

(56) References Cited

U.S. PATENT DOCUMENTS

| | | | | |
|---|---|---|---|---|
| 5,710,715 A | * | 1/1998 | Shitanda | G01H 1/003 702/56 |
| 5,852,793 A | * | 12/1998 | Board | G01H 1/003 702/56 |
| 2005/0029476 A1 | * | 2/2005 | Biester | F16K 31/041 251/58 |
| 2005/0050423 A1 | * | 3/2005 | Yasukawa | B41J 29/38 714/742 |
| 2011/0295127 A1 | * | 12/2011 | Sandler | A61B 7/026 600/528 |
| 2015/0216762 A1 | * | 8/2015 | Oohashi | A61M 21/02 601/47 |
| 2017/0084094 A1 | * | 3/2017 | Worden | G07C 5/0808 |
| 2019/0279447 A1 | * | 9/2019 | Ricci | G08G 1/0968 |

* cited by examiner

*Primary Examiner* — Raul J Rios Russo
*Assistant Examiner* — Carl F. R. Tchatchouang
(74) *Attorney, Agent, or Firm* — Nixon Peabody LLP; Justin D. Swindells

(57) ABSTRACT

A method for measuring health of a motor includes: (a) measuring, by an electrocardiogram sensor, vibration of the motor to obtain at least two electrical signals with each of the at least two electrical signals representing a harmonic of the vibration of the motor; (b) comparing each of the at least two electrical signals with a corresponding baseline; (c) based on the comparison, determining whether any one of the at least two electrical signals includes one or more artifacts wherein an artifact in a respective one of the at least two electrical signals is a deviation from a respective one of the corresponding baseline; and (d) based on any one of the at least two electrical signals including the one or more artifacts, providing an estimated time to failure for the motor.

20 Claims, 11 Drawing Sheets

SYSTEMS AND METHODS FOR DETERMINING LIFE OF A MOTOR USING ELECTROCARDIOGRAM (EKG) SENSORS

CROSS-REFERENCE TO RELATED APPLICATIONS

This application claims the benefit of and priority to U.S. Provisional Application No. 62/983,229, filed Feb. 28, 2020, which is hereby incorporated by reference herein in its entirety.

TECHNICAL FIELD

The present disclosure relates to determining health of a motor and more specifically to systems and methods for ascertaining life of motors using electrocardiogram sensors.

BACKGROUND

Motors are ubiquitous in engineering systems and convert one form of energy into mechanical energy. Electric motors convert electrical energy into mechanical energy to propel some mechanism of engineering systems. Electric Motors can be powered by direct current (DC) or alternating current (AC), can be brushed or brushless, and can be of various phases. Electric motors can use very little amount of energy, as those in electric watches, or can use relatively much higher amount of energy as those used in ship propulsion. Electric motors thus span very many different applications, for example, fans, elevators, toys, appliances, tools, kitchen blenders, vacuum cleaners, furniture, etc. With such prevalence of motors in society, a motor failing can be devastating. For example, a ship's propulsion motor failing at sea can put passengers at risk, an industrial fan's motor failing can disrupt airflow in a factory putting workers on the factory floor at risk of being exposed to high concentrations of carcinogenic agents, etc. The present disclosure provides systems and methods for ascertaining health of a motor. The present disclosure also provides systems and methods for testing and discriminating between motors.

SUMMARY

Some implementations of the present disclosure provide a method for measuring health of a motor which includes: (a) measuring, by an electrocardiogram sensor, vibration of the motor to obtain at least two electrical signals with each of the at least two electrical signals representing a harmonic of the vibration of the motor; (b) comparing each of the at least two electrical signals with a corresponding baseline; (c) based on the comparison, determining whether any one of the at least two electrical signals includes one or more artifacts wherein an artifact in a respective one of the at least two electrical signals is a deviation from a respective one of the corresponding baseline; and (d) based on any one of the at least two electrical signals including the one or more artifacts, providing an estimated time to failure for the motor.

The foregoing and additional aspects and implementations of the present disclosure will be apparent to those of ordinary skill in the art in view of the detailed description of various embodiments and/or implementations, which is made with reference to the drawings, a brief description of which is provided next.

BRIEF DESCRIPTION OF THE DRAWINGS

The foregoing and other advantages of the present disclosure will become apparent upon reading the following detailed description and upon reference to the drawings.

Figure 1:
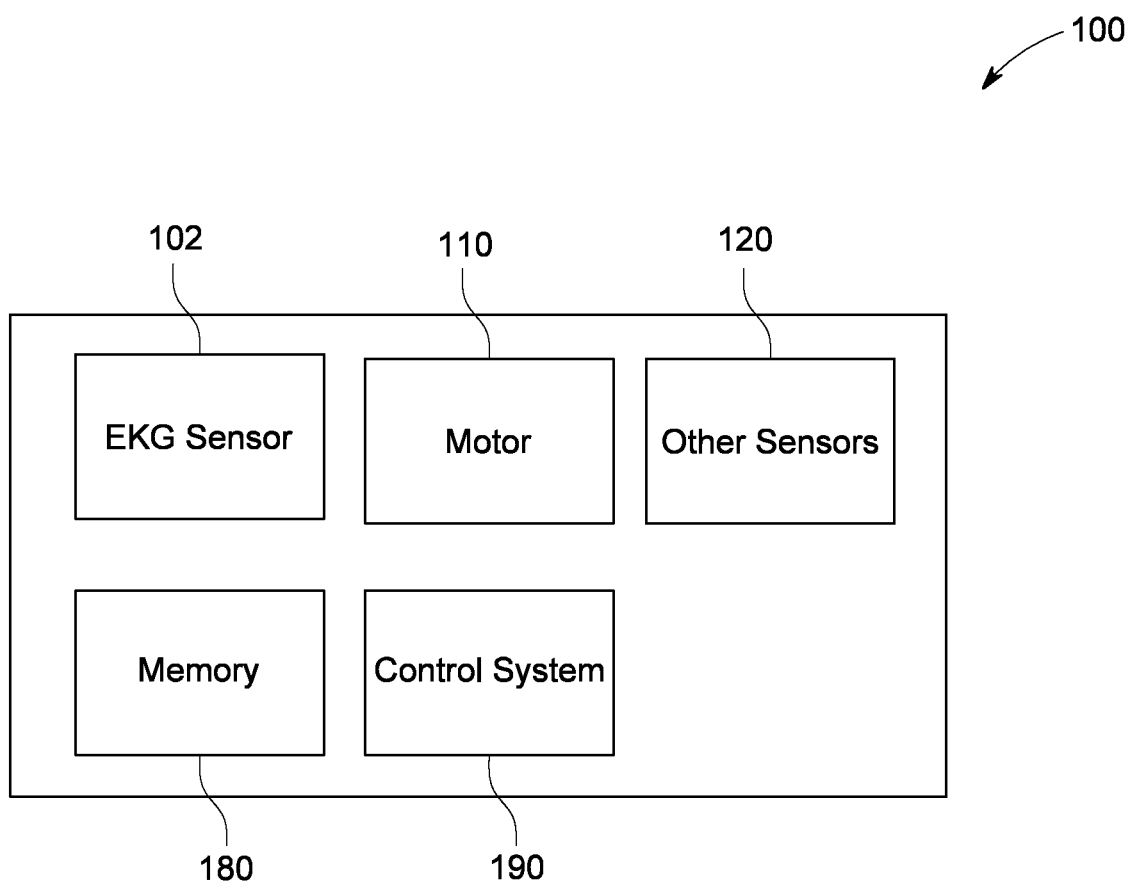
FIG. 1 illustrates a block diagram of a system for determining health of a motor, according to some implementations of the present disclosure.

While the present disclosure is susceptible to various modifications and alternative forms, specific implementations have been shown by way of example in the drawings and will be described in detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

Engineered components typically have a measured lifetime. Measured lifetime can take on different meanings in various contexts. The measured lifetime can be expressed as a product lifetime (or lifespan) which is a time interval from when a product is sold to when the product is discarded. The measured lifetime can also be expressed in terms of a service life which is a time interval that the product works and can be used. Product lifetime of a product can be much longer than service life of the product. Manufacturers in some domains seek to lower service life of products through planned obsolescence such that consumers continue to replace older products with newer products and the manufacturers guarantee a level of annual sales. Manufacturers in other domains seek to increase service life of products so that the manufacturers can sell the products at a higher cost, improve the manufacturers' brand quality and reputation, and reap additional revenue from offering multi-year warranties.

Consumers can have a different mindset when paying for expensive products based on cultural expectations. For example, consumers can be willing to pay more for a home appliance or furniture because these items are rarely replaced compared to other household items. Customers' appliances and furniture have both a longer product lifespan and a longer service life than, for example, their smartphone. Customers can trade-in their expensive smartphone within a year but may keep their expensive piece of furniture for five years or more.

Furthermore, incorporating movable parts in products can reduce their measured lifetime. That is, movement introduces higher degrees of freedom of configuring a product such that failure of the product can be classified in higher dimensions because of the movement. For example, a stationary chair only has one configuration so when it loses this configuration, the product fails. On the other hand, a folding chair has at least two configurations: (1) folded configuration for storage, (2) unfolded configuration for use, and (3) configurations during transition from the folded configuration to the unfolded configuration and vice versa. If the folding chair fails to transition from one configuration to another, the folding chair product has failed. With more configurations provided for a product, the more ways the product can fail.

Products with motors employ movable parts, therefore, motors introduce higher degrees of freedom for configuring the products. Motor failure in such products means that the products fail to perform as intended. In some products, motor operation can be bypassed, and the products can be used in a manual mode, but in other products, such luxury is not afforded. For example, a motorized wheelchair can be very heavy due to additional electronic components necessitated by inclusion of a motor to the wheelchair. So when the wheelchair fails, manually operating the wheelchair can be a daunting task. Embodiments of the disclosure provide a way for manufacturers to estimate useful life of products with motors before motor failure. This can allow manufacturers to offer a more robust warranty for a warranty period and have customers on notice to schedule preventative maintenance before motor failure.

FIG. 1 illustrates a block diagram of a system 100 for determining health of a motor 110 according to some implementations of the present disclosure. The motor 110 can be an electric motor. The system 100 includes an electrocardiogram (EKG) sensor 102, a memory 180, and a control system 190. In some implementations, the system 100 includes other sensors 120, e.g., a camera or a photosensor for detecting light, a temperature sensor for determining temperature of the motor 110, a microphone for capturing sound of the motor 110, or any combination thereof.

EKG sensors are typically used to capture electrical signals associated with electrical activity in biological animals. However, in FIG. 1, the EKG sensor 102 is configured to capture vibration activity associated with the motor 110 when the motor 110 is turned on. The EKG sensor 102 generates signals at certain frequencies related to the vibration activity of the motor 110. The EKG sensor 102 does not directly measure vibration activity of the motor 110. Since the motor 110 is an energy transducer that converts electrical energy into mechanical energy, the vibration activity of the motor 110 can be linked to electrical current(s) flowing through different parts of the motor 110. The EKG sensor 102 provides a way to probe the electrical current or probe electromagnetic activity within the motor 110 without having to reconfigure circuitry of the motor 110. The EKG sensor 102 captures electrical properties of vibration to inform on how the motor 110 is performing. The EKG sensor 102 detects electric field created by the motor and senses how that electric field changes over time. In some implementations, the EKG sensor 102 provides frequency and amplitude of the electric field of the motor.

In some implementations, the system 100 includes the other sensors 120. The other sensors 120 can include a photodetector. Photodetectors detect ambient light in an environment of the motor 110. Light exposure can affect performance of the motor 110 because it can contribute to the motor 110 running at a higher temperature. Motors running at higher temperatures are susceptible to performance degradation, due to for example, winding resistance increase as temperature increases which can lead to power losses, reduced motor speed, and/or motor stalls.

The other sensors 120 can include a temperature sensor. The temperature sensor can provide an operating temperature of the motor 110. The operating temperature of the motor 110 can affect performance and lifespan of the motor 110. If the motor 110 consistently runs at a high temperature, then the motor 110 will have a shorter lifespan than if the motor 110 ran at a relatively lower temperature. The difference between lifespan in these situations can be quantified if temperature effects are modeled for the motor 110.

The other sensors 120 can include a humidity sensor. The humidity sensor can provide humidity levels for the environment that the motor 110 is operating in. A motor running in a high humidity area can have a shorter lifespan than a motor running in a relatively lower humidity area. The difference between lifespan in these situations can be quantified if humidity effects are modeled for the motor 110. Humidity can cause insulation of the motor 110 to trap moisture. Humidity above 60% can lead to corrosion of metallic components within the motor 110. Thus, the humidity sensor can be used to determine whether to dry the motor 110 prior to turning on the motor 110. The humidity sensor can be used to determine load conditions of the motor 110. For example, humidity above 60% can reduce the effective load that the motor 110 can drive.

The other sensors 120 can include a microphone to capture sound in a vicinity of the motor 110. Vibration of the motor 110 can produce sound that can be captured by the microphone. Furthermore, ambient sound or noise in the environment can be captured by the microphone. Sound data provided by the microphone can be used to verify EKG sensor 102 vibration data. Furthermore, the sound data can be analyzed for audio frequencies to determine spectral qualities, for example, a shape of a sound spectrum of the captured sound, dominant frequencies present in the sound data, how loud the motor 110 is vibrating, etc. A microphone is used here as an example, but piezoelectric based vibration sensors can be used in other implementations.

The system 100 further includes a memory 180. The memory 180 can include one or more physically separate memory devices, such that one or more memory devices can be coupled to and/or built into the control system 190 and/or one or more external devices (e.g., mobile phones, computers, servers, cloud based devices, etc.) wirelessly coupled and/or wired to the system 100. The memory 180 acts as a non-transitory computer readable storage medium on which is stored machine-readable instructions that can be executed by the control system 190 and/or one or more other systems. The memory 180 is also able to store the data generated by the EKG sensor 102 and/or the other sensors 120. In some implementations, the memory 180 includes non-volatile memory, static random access memory (RAM), EEPROM memory, flash memory, or any combination thereof.

Like the memory 180, the control system 190 can be coupled to the other sensors 120, the EKG sensor 102, or any electronic device. The control system 190 is coupled to the memory 180 such that the control system 190 is configured to execute the machine-readable instructions stored in the memory 180. The control system 190 can include one or more processors and/or one or more controllers. In some implementations, the control system 190 is a dedicated electronic circuit. In some implementations, the control system 190 is an application-specific integrated circuit. In some implementations, the control system 190 includes discrete electronic components.

The control system 190 is able to receive input(s) (e.g., signals, generated data, instructions, etc.) from any of the other elements of the system 100 (e.g., the sensors, etc.). The control system 190 is able to provide output signal(s) to cause one or more actions to occur in the system 100 (e.g., to cause values to be displayed on a screen, etc.). In some implementations, the control system 190 receives signals at a baud rate of 57000.

Figure 2:
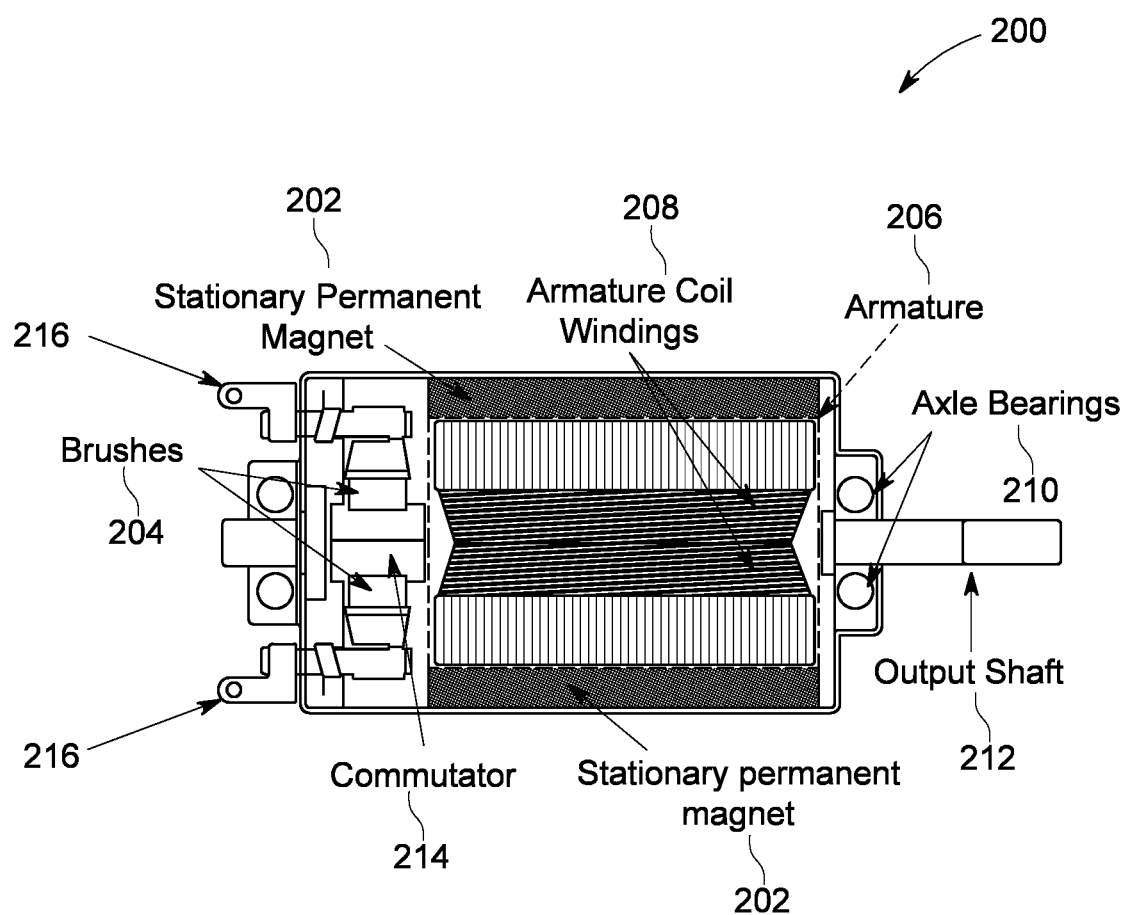
FIG. 2 illustrates a motor, according to some implementations of the present disclosure.

FIG. 2 illustrates a DC motor 200 according to some implementations of the present disclosure. The DC motor 200 is merely provided as an example for illustrating some implementations of the present disclosure. Embodiments of the present disclosure can be applied to AC motors as well as DC motors. An AC motor consists of a stator and a rotor. The stator provides a magnetic field, and the rotor rotates providing a rotating magnetic field. The rotating magnetic field pushes on the rotor creating a torque force which is delivered to a device attached to the AC motor. DC motors are slightly different as illustrated in FIG. 2. The DC motor 200 includes a stator 202 and an armature 206. The stator 202 and the armature 206 produce torque that can be delivered to a device connected to the DC motor 200. However, the DC motor 200 can have its rotations per minute changed by changing the supply of current to the power electrodes 216 (unlike AC motors). Thus, DC motor 200 can have different speeds based on power provided to the DC motor 200.

The DC motor 200 includes brushes 204. Brushes 204 allow the DC motor 200 to be powered by a DC power source. The DC motor 200 also includes a commutator 214. The commutator 214 allows current reversal with a DC power source being applied to the brushes 204 such that power is provided to the armature 206 in a consistent manner while the rotor with axle bearings 210 rotates. The stator 202 can be permanent magnets. The armature 206 includes electromagnetic coil windings 208 for generating a changing magnetic field in the armature 206 when power is provided to the DC motor 200. When power is provided to the DC motor 200, the rotor 210 rotates causing torque to be transferred to a shaft 212.

There are multiple points of failure for a motor. For example, in the DC motor 200, the electromagnetic coil windings 208 can wear down due to heat generated within the DC motor 200. Friction can build up in the DC motor 200 such that movable parts do not move as freely as when the DC motor was newly manufactured. Efficiency of the DC motor 200 can thus be affected, requiring even higher levels of energy to be provided for generating a same level of torque.

Figure 3:
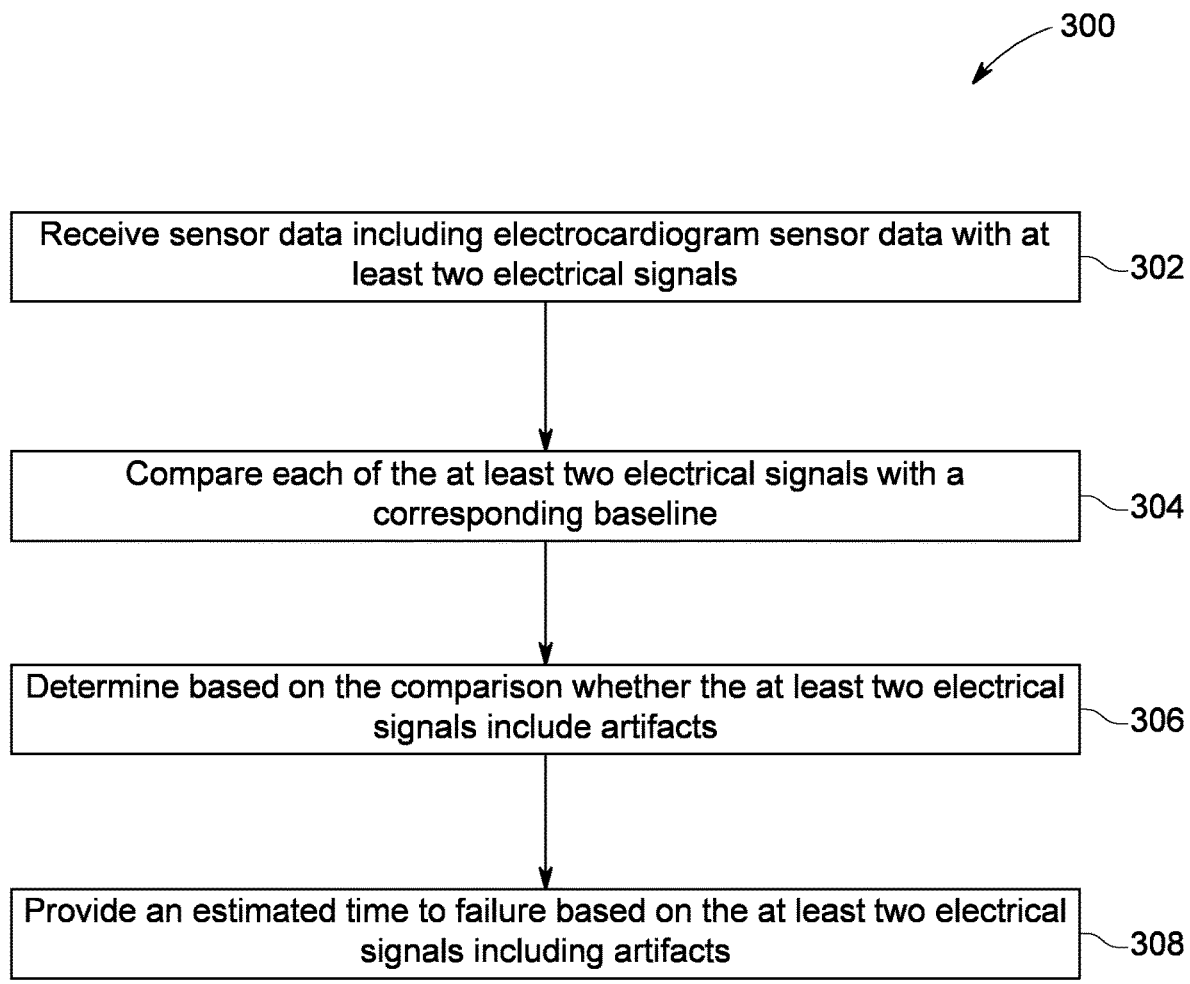
FIG. 3 is a flow diagram illustrating a process for determining health of the motor according to some implementations of the present disclosure.

FIG. 3 is a flow diagram illustrating a process 300 for determining health of the motor (e.g., the motor 110) according to some implementations of the present disclosure. At step 302, the control system 190 receives sensor data including electrocardiogram (EKG) sensor data. The control system 190 receives the sensor data generated by the EKG sensor 102. In some implementations, the control system 190 additionally receives sensor data including other information from the other sensors 120 as previously described in connection with FIG. 1. The electrocardiogram sensor data received is a measure of a vibration of the motor 110. The electrocardiogram sensor data includes at least two electrical signals, with each of the at least two electrical signals representing a harmonic of the vibration of the motor 110.

At step 304, the control system 190 compares each of the at least two electrical signals with a corresponding baseline. Baselines for each of the at least two electrical signals were previously generated from a reference motor. In some implementations, the reference motor is a motor of a same type as the motor 110 under test. That is, the reference motor is used as a representative performance target for motors such that if the motor 110 performs as well as or within an acceptable degraded performance from the reference motor, then the motor 110 is deemed to be functioning properly. In some implementations, the reference motor is an earlier measurement of the motor 110 at a previous time before the current measurement. That is, the earlier measurement of the motor 110 is used as a baseline to determine change in performance or a level of degradation of performance of the motor 110 over a period of time between the earlier measurement and the current measurement.

At step 306, the control system 190 determines, based on the comparison at step 304, whether any one of the at least two electrical signals includes one or more artifacts. An artifact in a respective one of the at least two electrical signals is a deviation from a respective one of the corresponding baselines of step 304. For example, the control system 190 can overlay in a graphical domain the baselines and the electrocardiogram sensor data including the at least two electrical signals. The control system 190 can fit a curve to each one of the baselines and determine respective magnitudes of departure at certain areas of the fit curves to respective ones of the at least two electrical signals. Artifacts can include (1) high frequency oscillations around a fit curve for a specific area of the fit curve, (2) decrease in overall magnitude, (3) deviations in magnitude over time, (4) disruptions, outages, or intermittent pauses in the electrical signals, etc.

At step 308, the control system 190 provides an estimated time to failure for the motor 110 based on any one of the at least two electrical signals including the one or more artifacts. The control system 190 identifies the type of artifacts in the one or more artifacts and uses a machine-learned model to determine an estimate of how long the motor 110 will be operational before failure. In some implementations, a number of artifacts presented in a time period can be measured and extrapolated for an expected number of artifacts before failure. For example, if five artifacts are present in a thirty-minute period, and the expected number of artifacts before failure is determined to be ten million, then the five artifacts are added to an accumulated number of artifacts observed so far. And the rate of five artifacts per thirty minutes can be used to determine how many more minutes the motor 110 can run before reaching the ten million artifacts.

In some implementations, the time between artifacts is used to estimate the relative time to failure for the motor 110.

For example, if the motor 110 presents artifacts every few months, the time to failure is determined to be greater than if the motor 110 presents artifacts every few days, hours, minutes, etc. Given a similar estimated load driven by the motor 110, the presentation of artifacts can be an indication of a beginning of failure. In some cases, the estimated time to failure for the motor 110 is thus directly related to the time between artifacts. For example, if the time between artifacts is 3 days, then a comparison to a reference motor can be made where 3 days between artifacts equates to about 4 years of remaining life, and 10 hours between artifacts equates to about 6 months of remaining life.

In some implementations, the presentation of artifacts can be combined with directionality of the motor 110 to determine estimated life for the motor 110. For example, when the rotor of the motor 110 rotates counterclockwise, the time between artifacts is a first value, and when the rotor of the motor 110 rotates clockwise, the time between artifacts is a second value. In some implementations, the first value is greater than the second value. Since the second value is less than the first value, the clockwise rotation can be used as a determination of estimated life for the motor 110. For example, if the motor 110 is used for a folding chair, then the chair being able to fold but not unfold indicates a failure, and the chair being able to unfold but not fold also indicates a failure. The electrocardiogram sensor data from the motor 110 can be used to determine whether the motor 110 will fail in one direction before the other (i.e., whether the chair will fail to unfold or whether the chair will fail to fold).

In some implementations, the control system 190 can identify a type of error associated with the one or more artifacts. For example, artifacts created by failing electromagnetic coil windings 208 can represent in the two or more electrical signals differently than artifacts created by failing brushes 204. For example, the brushes 204 in the DC motor 200 are involved in efficiently reversing current of the DC motor 200. Reversing directionality of the rotation of the DC motor 200 from a first direction to a second direction can present artifacts differently in the second direction than in the first direction. If the second direction indicates a shorter remaining life than the first direction, then the brushes 204 can be implicated as the failing component.

In some implementations, a machine-learned model is developed to determine the remaining life of the motor 110 based on observed artifacts. The machine-learned model can be trained for a test motor using various parameters associated with the test motor. The parameters can include a motor type identification, time between observed artifacts, duration of the observed artifacts, timing of the observed artifacts, observed lifetime of the test motor, etc. The motor type identification is a classification of the motor (e.g., a serial number associated with the motor, a manufacturer part number, a load rating for the motor, etc.). The timing of the observed artifacts are timestamps when the artifacts were observed, measured from an initial turning ON of the motor. For example, if the motor is turned on at time t=0, and an artifact is observed at time t=4 seconds, then the timing of the observed artifact is time t=4 seconds.

The test motor can be run continuously until failure in a testing factory such that a lower bound on the lifetime of the test motor can be obtained. The time till failure obtained by continuously running the test motor is a lower bound because a typical consumer may not run the motor continuously, and as such, the motor may not exhibit a same level of wear and tear and a longer lifetime can thus be obtained. Appearance or presentation of different artifacts can thus be used to indicate age of the motor at different times during the lifetime of the test motor. For example, a one to two-year old motor can present no artifacts, a three to four-year old motor can present an artifact every six months, a seven to eight-year old motor can present an artifact every two months, a nine-year old motor can present an artifact every month, a ten-year old motor can present an artifact every week, an eleven-year old motor can present an artifact every day, etc.

In some implementations, if time between artifacts is used to estimate life, and the test motor is observed to fail in the twelfth year, then the data from the test motor can be extrapolated to other motors of the same kind. For example, data obtained from the test motor can be used to train the machine-learned model such that a regression relationship can be modeled. The machine-learned model can take, as input, various parameters and can provide, as output, an estimated age of a sample motor, if that sample motor were run continuously. The estimated age of the sample motor can be compared to the observed life of the test motor to gauge remaining life of the motor.

The estimated age of the sample motor provides a quantitative measure of remaining life of the sample motor. The estimated age of the sample motor can be used to gauge wear and tear of the sample motor over time. For example, different motors can age differently based on statistical variations in manufacturing processes for the motors and actual use of the motors over time. As such, the estimated age can be used as a comparative benchmark for the motors. For example, two motors, a first motor and a second motor, from a same manufacturing process can be used differently over a period of five years. A machine-learned model, in accordance with some implementations of the present disclosure, can be used to provide an estimated age of the two motors. The machine-learned model can determine that the first motor has an estimated age of two years and the second motor has an estimated age of four years. During the five-year period, the first motor is determined to have more remaining life than the second motor, since the first motor is effectively "younger" than the second motor although both were built at the same time using the same manufacturing process.

As discussed, embodiments of the present disclosure can be used to check or track a trajectory of life of a sample motor. The sample motor can be quoted as having an estimated age and a remaining life based on the estimated age and expected total life. The expected total life can be the observed life or can be based on the observed life of one or more test motors run continuously, as discussed above.

In some implementations, a machine learned model can be used to link types of artifacts with specific failure points of a motor in a similar manner as estimating lifetime of the motor. For example, an overheating condition on a test motor can present a first artifact or a first series of artifacts, an overload condition can present a second artifact or a second series of artifacts, an imbalance condition can present a third artifact or a third series of artifacts, a loose shaft condition can show a fourth artifact or a fourth series of artifacts, etc. The machine learned model, once trained, can take as input EKG electrical signals over a period of time and provide as output the type of artifact present.

Figure 4A:
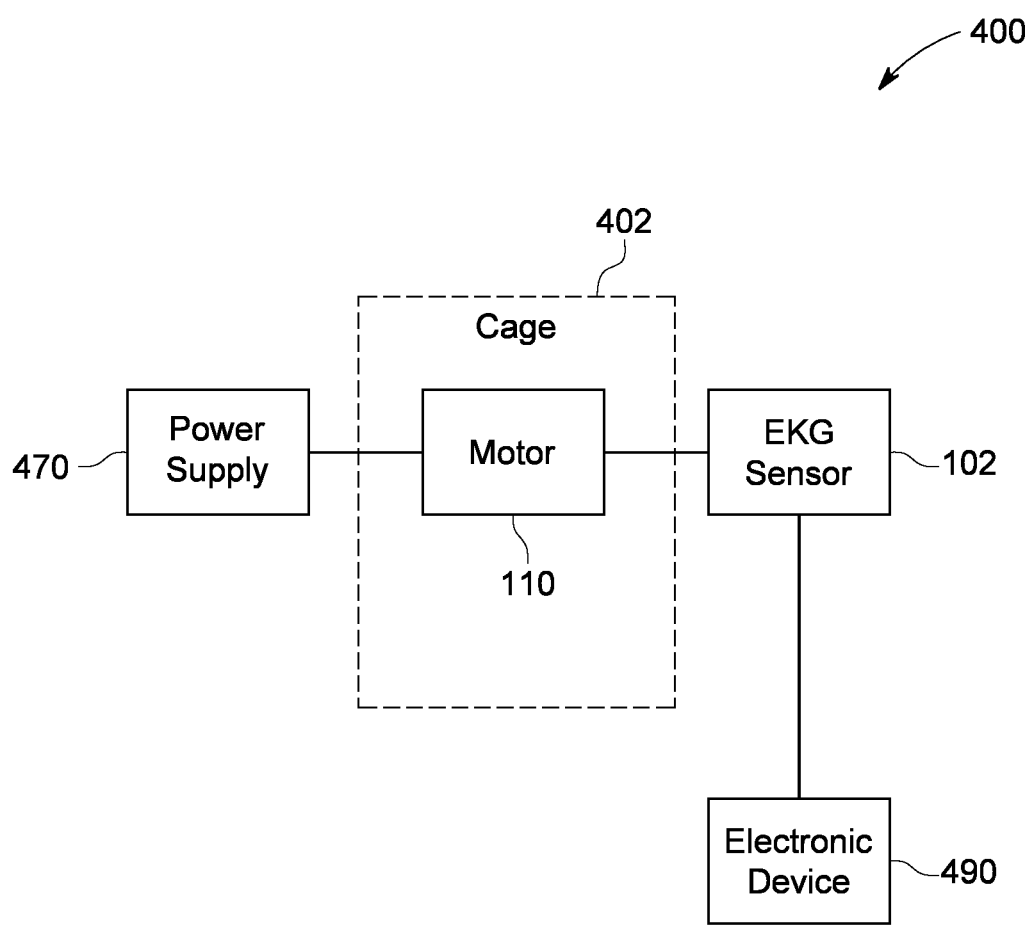
FIG. 4A illustrates a block diagram of a test setup, according to some implementations of the present disclosure.

FIG. 4A illustrates a block diagram of a test setup 400, according to some implementations of the present disclosure. The test setup 400 includes a cage 402 housing a motor 110. The cage 402 can enclose the motor 110 such that the motor 110 is strapped into or attached to an inner surface of the cage 402. The cage 402 can have an outer surface such that the EKG sensor 102 is attached to an outer surface of the cage 402 to capture electromagnetic radiation within the cage 402. The cage 402 can be made of plastic material so as to not shield or interfere with the electromagnetic waves generated from the motor 110.

The EKG sensor 102 can connect to an electronic device 490. The electronic device 490 can perform functions previously described with respect to the control system 190 of FIG. 1. Examples of the electronic device 490 include a laptop computer, a desktop computer, a smartphone, an embedded device, etc.

The test setup 400 also includes a power supply 470. The power supply 470 can be provided either inside the cage 402 or outside the cage 402. FIG. 4 illustrates the power supply 470 outside the cage 402. The power supply 470 provides power to the motor 110. The power supply 470 can provide either AC power or DC power, depending on requirements of the motor 110. The motor 110 converts the supplied electrical power from the power supply 470 to mechanical power to drive a load (not shown).

Figure 4B:
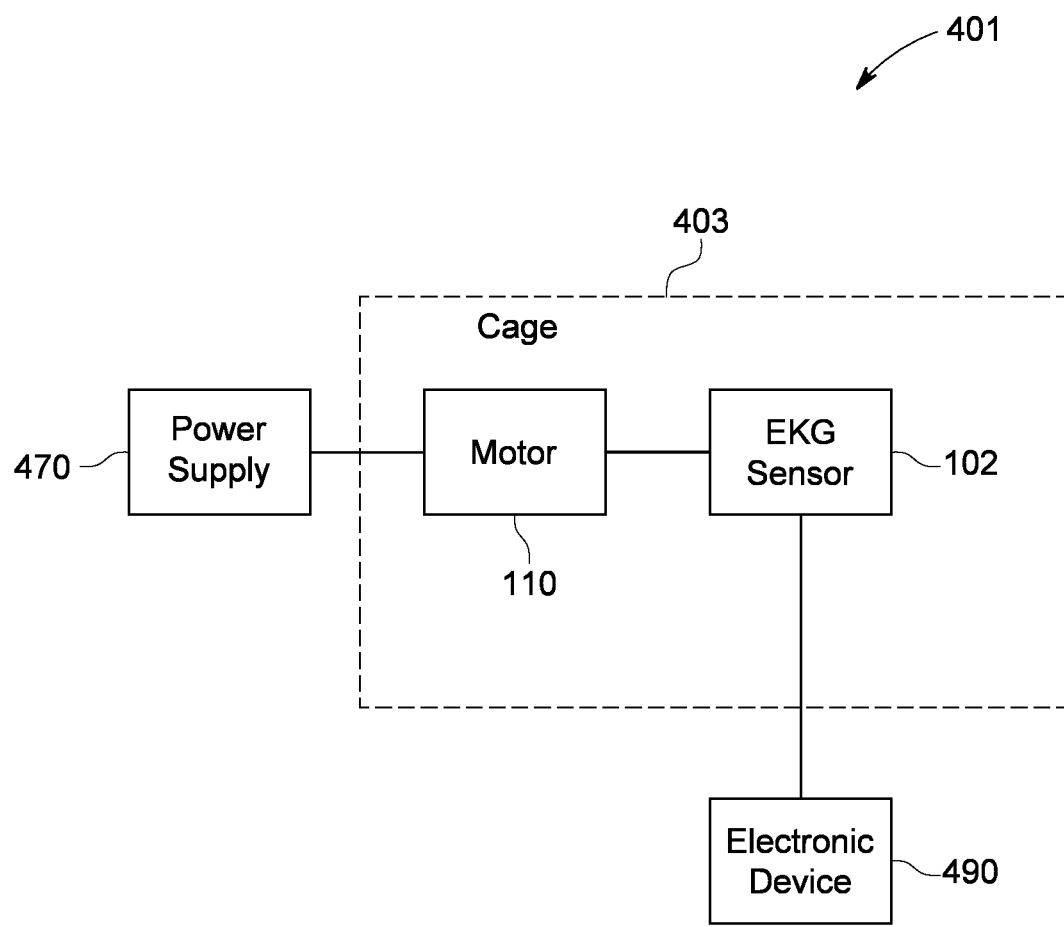
FIG. 4B illustrates a block diagram of another test setup, according to some implementations of the present disclosure.

FIG. 4B illustrates a block diagram of a test setup 401, according to some implementations of the present disclosure. The test setup 401 shows the EKG sensor 102 inside a cage 403. The cage 403 is optional in FIG. 4B. The cage 403 can be a metal cage for shielding or terminating electromagnetic radiation generated by the motor 110, the power supply 470, and/or the electronic device 490. The cage 403 ensures that the electromagnetic radiation from the motor 110 is not interfered with by outside electromagnetic radiation. In the test setup 401, the EKG sensor 102 is directly attached to the motor 110 (i.e., leads of the EKG sensor 102 are directly attached to the body of the motor 110). FIGS. 5-10 provide example experimental results based on the test setup 401 without the cage 403. The baud rate for the results in FIGS. 5-10 is 57,000. The motor 110 drove a load (not shown) in each of FIGS. 5-10.

Figure 5:
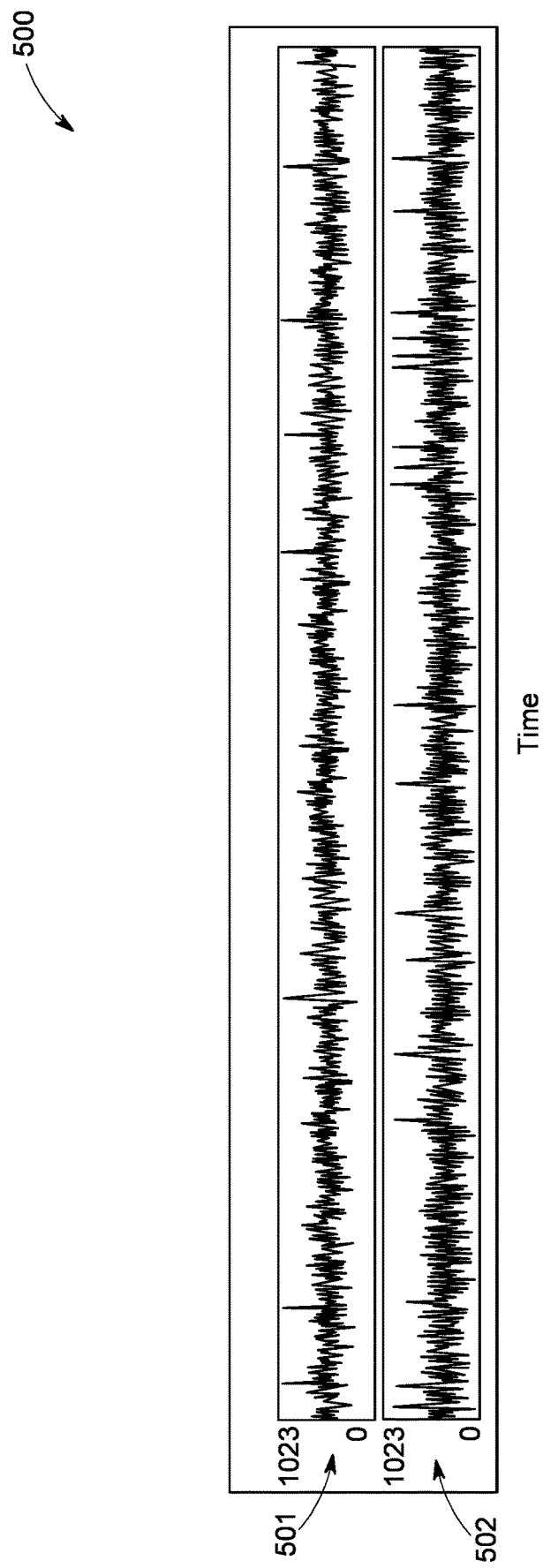
FIG. 5 is a graph showing signals from electrocardiogram sensors for a motor in normal operation, according to some implementations of the present disclosure.

FIG. 5 is a graph showing signals 501 and 502 from EKG sensors for a motor in normal operation, according to some implementations of the present disclosure. Using the test setup 401 (FIG. 4B) without the cage 403, the signal 502 is obtained on a part of the motor that is closer to power signals obtained from the power supply 470. The signal 501 is obtained on a part of the motor that is farther away from power signals obtained from the power supply 470. As such, overall, the amplitude of the signal 501 is lower than the amplitude of the signal 502 due to less power feeding from the power supply 470 influencing the signal 502. The signals 501 and 502 have a high frequency and about a near consistent or constant amplitude while the motor is operating.

Figure 6:
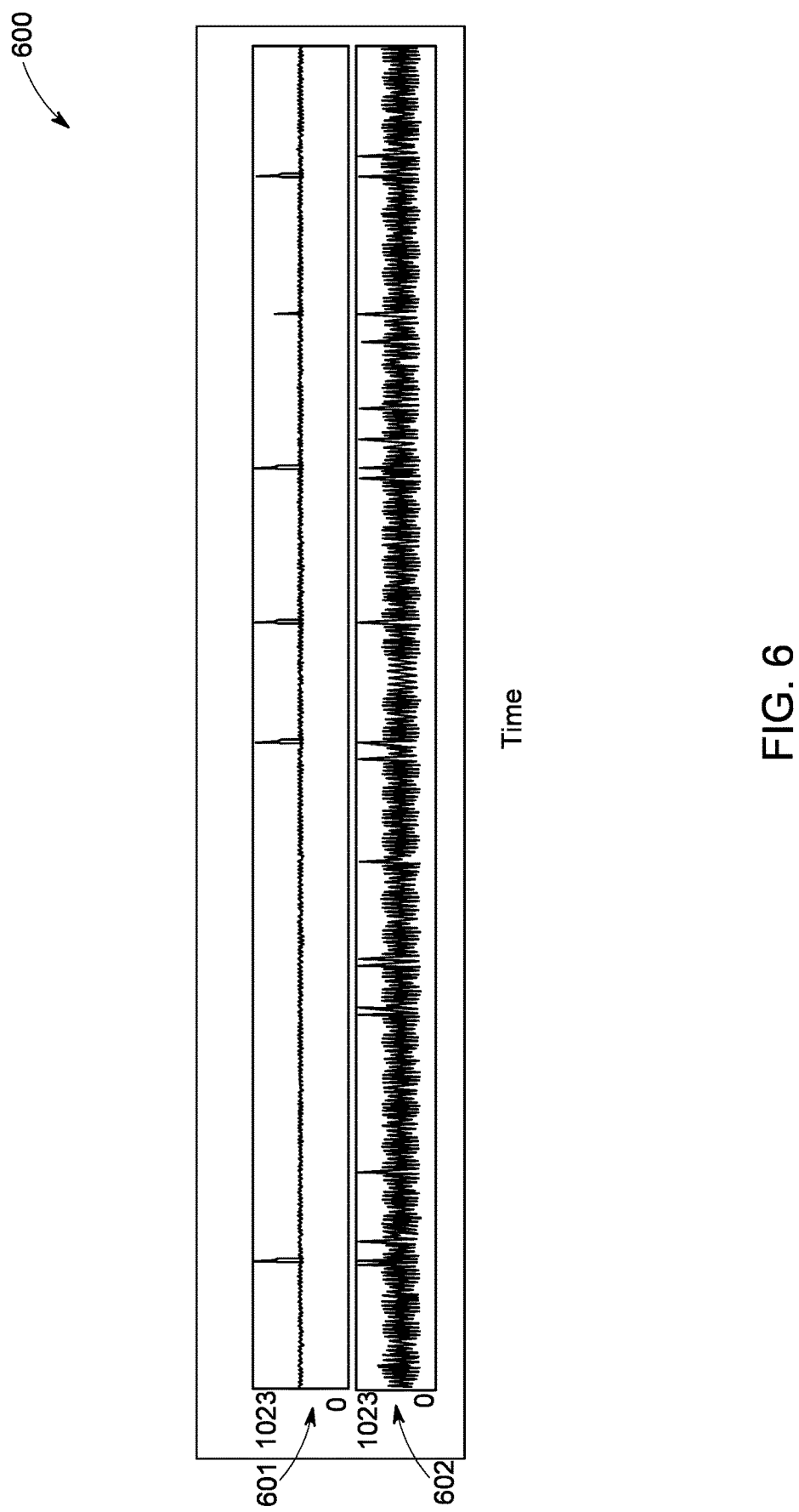
FIG. 6 is a graph showing a first artifact in electrical signals from the electrocardiogram sensors of the motor in FIG. 5, according to some implementations of the present disclosure.

FIG. 6 is a graph showing a first artifact in electrical signals from the EKG sensors of the test setup of FIG. 5, according to some implementations of the present disclosure. Signals 601 and 602 correspond to electrical signals obtained from lead placements on the motor, identical to the lead placement used in obtaining the signals 501 and 502 (FIG. 5), respectively. In FIG. 6, a motor under test is overloaded, and as such, the amplitude of the electrical signal 601 is muted while the amplitude of the electrical signal 602 mirrors power feedthrough noise. The signal 601 indicates that the motor is not rotating or not operating. The first artifact includes a zero amplitude during the period of time.

Figure 7:
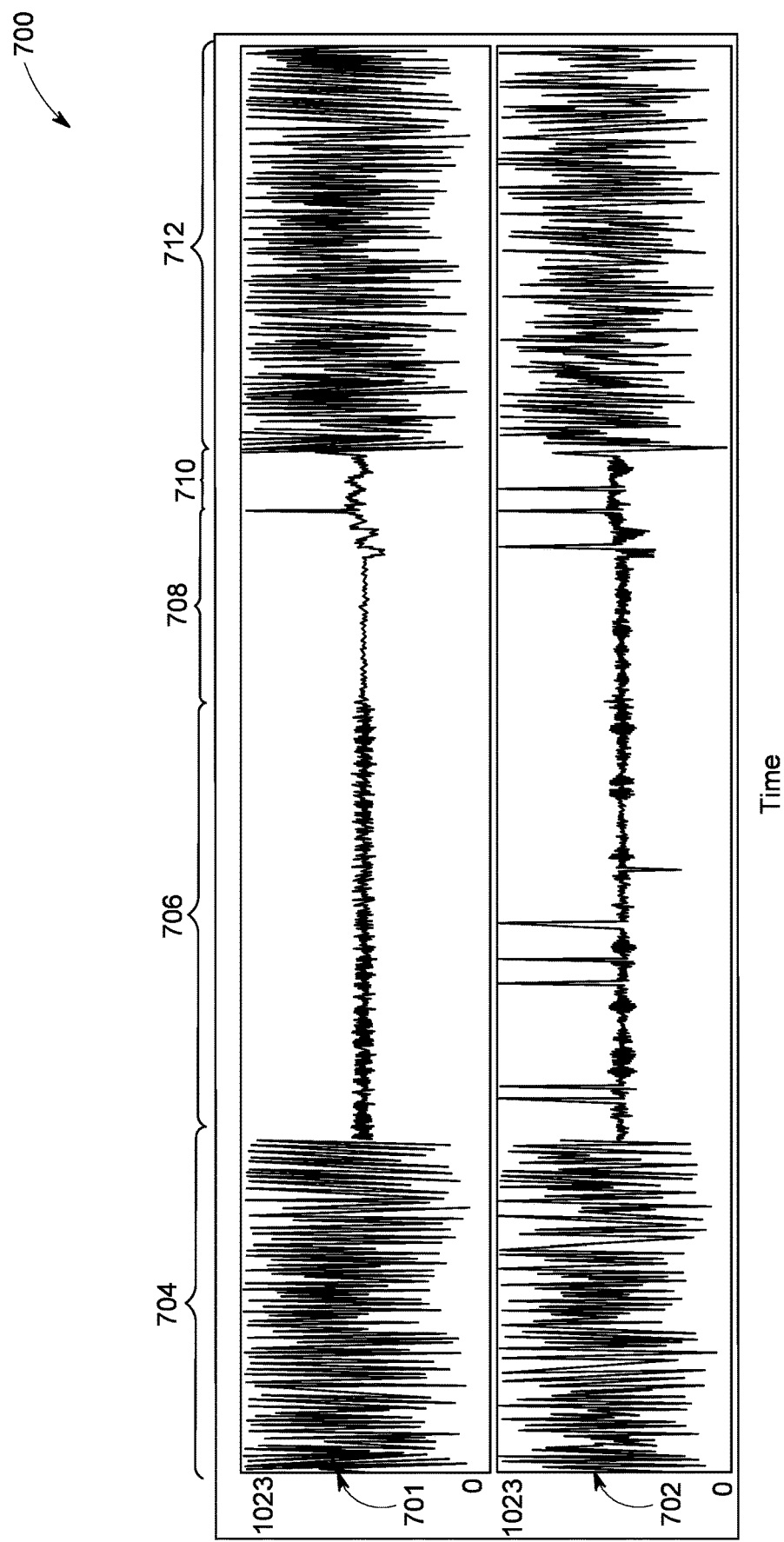
FIG. 7 is a graph showing a second artifact in electrical signals from the electrocardiogram sensors of the motor in FIG. 5, according to some implementations of the present disclosure.

FIG. 7 is a graph showing a second artifact in electrical signals from the EKG sensors of the test setup of FIG. 5, according to some implementations of the present disclosure. Signals 701 and 702 correspond to electrical signals obtained from lead placements on the motor, identical to the lead placement used in obtaining the signals 501 and 502 (FIG. 5), respectively. In a first time period 704, the motor is operating normally with the signals 701 and 702 being high frequency signals having about the same amplitude. During a second time period 706, the motor is struggling and potentially stalled with amplitudes of both signals 701 and 702 being drastically reduced. During a third time period 708, the signal 701 has an amplitude that is reduced to zero. During a fourth time period 710, the motor is beginning to start back up so the amplitude of the signal 701 is increasing although frequency of the signal 701 in the fourth time period 710 is much lower than frequency of the signal 701 during the first period 704. During a fifth time period 712, the motor is back to operating normally, thus, the signals 701 and 702 have similar characteristics in the fifth time period 712 as in the first time period 704. The second artifact includes a reduced amplitude in the second time period 706, due to the loss of driving current; a zero amplitude during the third time period 708; and an increasing amplitude in the fourth time period 710.

Figure 8:
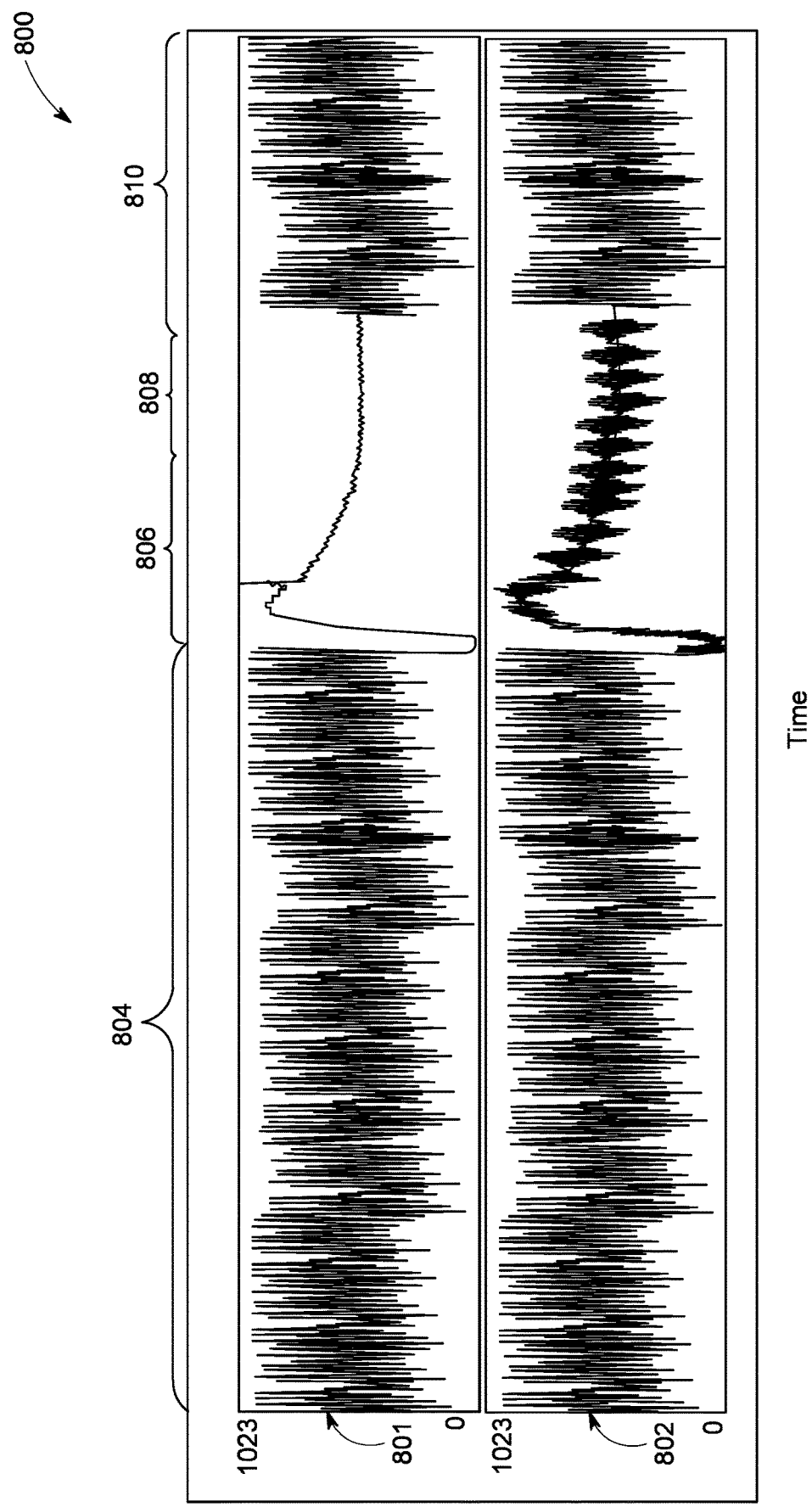
FIG. 8 is a graph showing a third artifact in electrical signals from the electrocardiogram sensors of the motor in FIG. 5, according to some implementations of the present disclosure.

FIG. 8 is a graph showing a third artifact in electrical signals from the EKG sensors of the test setup of FIG. 5, according to some implementations of the present disclosure. Signals 801 and 802 correspond to electrical signals obtained from lead placements on the motor, identical to the lead placement used in obtaining the signals 501 and 502 (FIG. 5), respectively. During a first time period 804, the motor is operating normally with signals 801 and 802 having a high frequency and a large amplitude. During a second time period 806, the frequency of the signals 801 and 802 decrease suddenly and the signals 801 and 802 start to decay with time. During a third time period 808, the signals 801 and 802 settle at a constant value. During a fourth time period 810, the motor returns to normal operation. The third artifact includes a sudden decrease in frequency during the second time period 806, a stalling of the motor during the third period 808. Note that the feedthrough from the power supply is visible in the signal 802 during the reduced frequency time periods 806 and 808.

Figure 9:
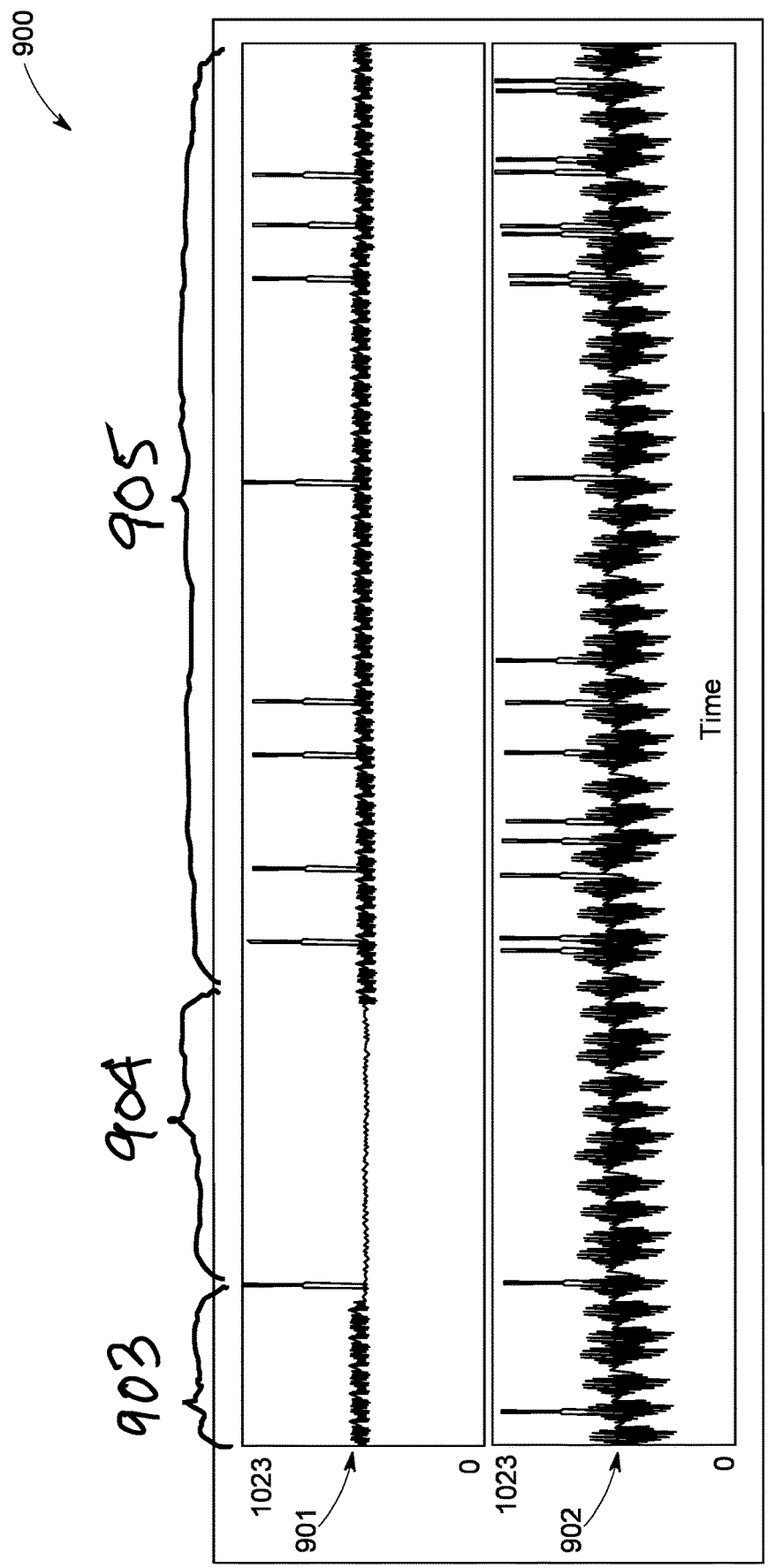
FIG. 9 is a graph showing a fourth artifact in electrical signals from the electrocardiogram sensors of the motor in FIG. 5, according to some implementations of the present disclosure.

FIG. 9 is a graph showing a fourth artifact in electrical signals from the EKG sensors of the test setup of FIG. 5, according to some implementations of the present disclosure. Signals 901 and 902 correspond to electrical signals obtained from lead placements on the motor, identical to the lead placement used in obtaining the signals 501 and 502 (FIG. 5), respectively. With minimum driving current, a first artifact is presented at time period 903. The lower amplitude of the driving current causes the motor to labor. As the motor labors, the reduction of driving current to the motor causes total loss of rotation at time period 904 (a second artifact). After total loss of rotation, current increased gradually to reach a threshold that permits rotation of the motor's shaft. At time period 905, the motor rotates with reduced driving current, hence the decreased amplitude of the signal 901.

Figure 10:
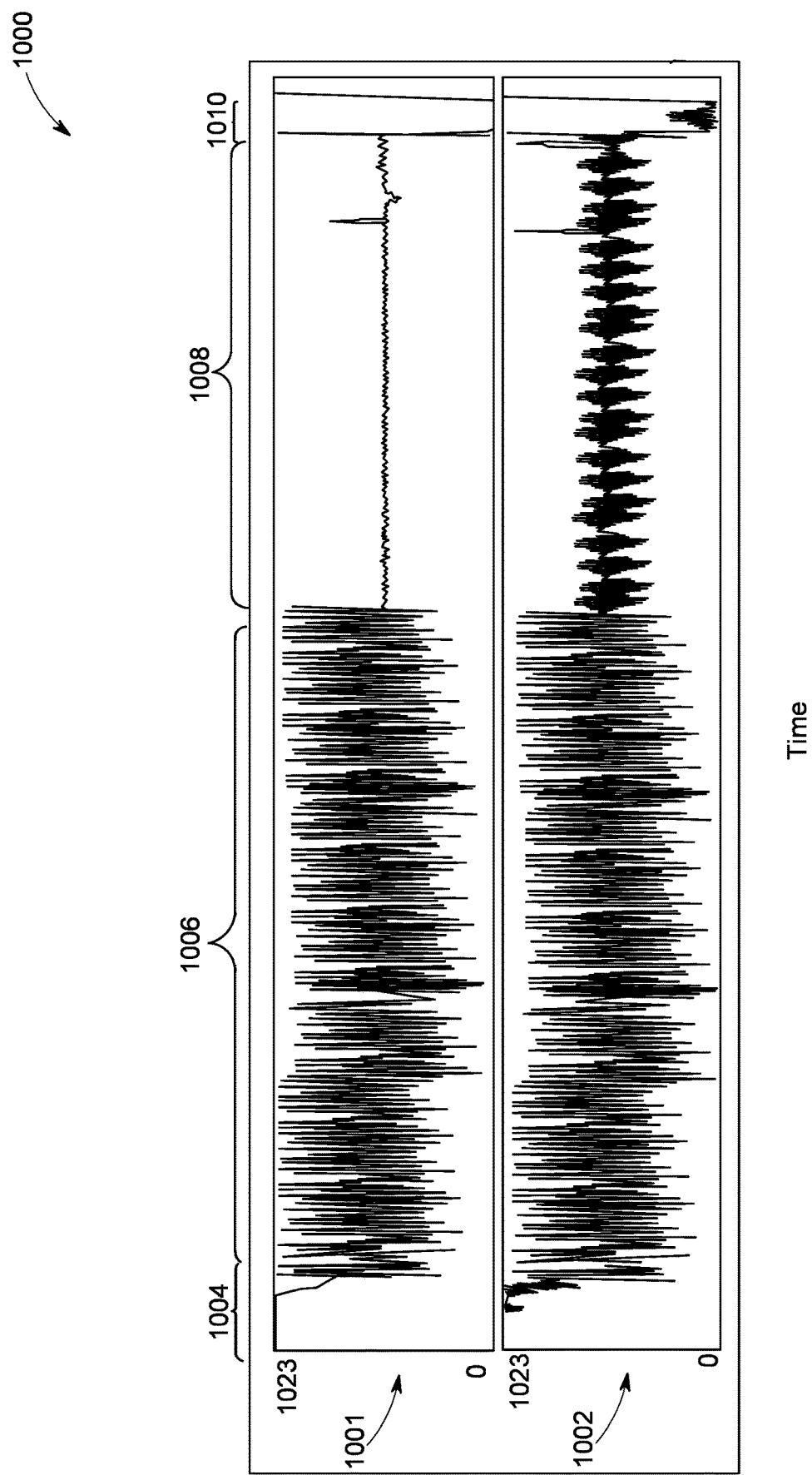
FIG. 10 is a graph showing a fifth artifact in electrical signals from the electrocardiogram sensors of the motor in FIG. 5, according to some implementations of the present disclosure.

FIG. 10 is a graph showing a fifth artifact in electrical signals from the EKG sensors of the test setup of FIG. 5, according to some implementations of the present disclosure. Signals 1001 and 1002 correspond to electrical signals obtained from lead placements on the motor, identical to the lead placement used in obtaining the signals 501 and 502 (FIG. 5), respectively. FIG. 10 includes four time periods 1004, 1006, 1008, and 1010. At the time period 1004, the amplitude of the signals 1001 and 1002 are reduced to zero. At the time period 1006, the motor returns to normal operation. At the time period 1008, the motor stalls (similar to the third time period 708 of FIG. 7). At the time period 1010, the motor is trying to recover, as such, the amplitudes of the signals 1001 and 1002 increase, but the frequency of the signals 1001 and 1002 are still much lower than frequency during normal operation. The signal 1002 exhibits feedthrough from the power supply, as discussed earlier, during the time period 1008. The feedthrough distorts the amplitude and frequency of the signal 1002 during the time period 1008 to appear non-zero.

While the present disclosure has been described with reference to one or more particular implementations, those skilled in the art will recognize that many changes may be made thereto without departing from the spirit and scope of the present disclosure. Each of these embodiments and implementations and obvious variations thereof is contemplated as falling within the spirit and scope of the present disclosure, which is set forth in the claims that follow.

What is claimed is:

1. A method for measuring health of a motor, comprising:
   measuring, by an electrocardiogram sensor, an electromagnetic field of the motor indicative of vibration of the motor to obtain at least two electrical signals, the electromagnetic field being measured from at least two different locations with one of the locations being more proximate to a power lead of the motor compared to the other locations;
   comparing each of the at least two electrical signals with a corresponding baseline;
   based on the comparison, determining whether any one of the at least two electrical signals includes one or more artifacts wherein an artifact in a respective one of the at least two electrical signals is a deviation from a respective one of the corresponding baseline; and
   based on any one of the at least two electrical signals including the one or more artifacts, providing an estimated time to failure for the motor.

2. The method of claim 1, further comprising providing a reason for any one of the at least two electrical signals having the one or more artifacts.

3. The method of claim 1, further comprising:
   receiving, from one or more sensors, sensor data including an ambient light level, a temperature of the motor, sound data produced by the motor, or any combination thereof,
   wherein the estimated time to failure for the motor is determined based at least in part on the one or more artifacts and the sensor data.

4. The method of claim 1, wherein the motor is located in an enclosure with an inner surface facing the motor and an outer surface facing away from the motor, and wherein the vibration of the motor is measured by the electrocardiogram sensor on the outside surface of the enclosure.

5. The method of claim 1, wherein the deviation includes a change in amplitude, a change in frequency, or any combination thereof.

6. The method of claim 1, wherein the motor is a motor used in furniture.

7. The method of claim 1, wherein the estimated time to failure is based at least in part on a time duration between two or more of the artifacts.

8. The method of claim 1, wherein the estimated time is failure is based at least in part on a duration of the at least one of the one or more artifacts.

9. A system for measuring health of a motor, comprising:
   an electrocardiogram sensor configured to generate at least two electrical signals based on a generated electromagnetic field of the motor in at least two different locations, the at least two electrical signals being indicative of a vibration of the motor and one of the locations being more proximate to a power lead of the motor compared to the other locations;
   a non-transitory computer readable medium storing machine-readable instructions; and
   a control system including one or more processors configured to execute the machine-readable instructions to:
      compare each of the at least two electrical signals with a baseline;
      based on the comparison, determine whether any one of the at least two electrical signals includes one or more artifacts wherein an artifact in a respective one of the at least two electrical signals is a deviation from the baseline; and
      based on any one of the at least two electrical signals including the one or more artifacts, provide an estimated time to failure for the motor.

10. The system of claim 9, wherein the control system is further configured to execute the machine-readable instructions to provide a reason for any one of the at least two electrical signals having the one or more artifacts.

11. The system of claim 9, further comprising:
    one or more sensors configured to generate sensor data including an ambient light level, a temperature of the motor, sound data produced by the motor, or any combination thereof,
    wherein the estimated time to failure for the motor is determined based at least in part on the one or more artifacts and the sensor data.

12. The system of claim 9, further comprising:
    an enclosure;
    wherein the motor is located in the enclosure with an inner surface facing the motor and an outer surface facing away from the motor, and wherein the vibration of the motor is measured by the electrocardiogram sensor on the outside surface of the enclosure.

13. The system of claim 9, wherein the deviation includes a change in amplitude, a change in frequency, or any combination thereof.

14. The system of claim 9, wherein the motor is a motor used in furniture.

15. The system of claim 9, wherein the estimated time to failure is based at least in part on a time duration between two or more of the artifacts.

16. The system of claim 9, wherein the estimated time to failure is based at least in part on a duration of the at least one of the one or more artifacts.

17. A method for measuring health of a motor, comprising:
    powering, via a power source, the motor to generate a changing electromagnetic field;
    measuring, by an electrocardiogram sensor, the changing electromagnetic field generated by the motor to obtain at least two electrical signals, the changing electromagnetic field indicative of a rotary motion of the motor;
    comparing each of the at least two electrical signals with a corresponding baseline;
    based on the comparison, determining whether any one of the at least two electrical signals includes one or more artifacts wherein an artifact in a respective one of the at least two electrical signals is a deviation from a respective one of the corresponding baseline; and
    based on any one of the at least two electrical signals including the one or more artifacts, providing an estimated time to failure for the motor.

18. The method of claim 17, wherein the electrocardiogram sensor is directly attached to at least two different locations on a body of the motor.

19. The method of claim 17, wherein the electrocardiogram sensor is attached to a cage enclosing the motor.

20. The method of claim 17, wherein the motor is enclosed in a cage, the cage shielding the motor from electromagnetic radiation of the power source.

* * * * *